(12) United States Patent
Cao et al.

(10) Patent No.: US 7,166,413 B2
(45) Date of Patent: *Jan. 23, 2007

(54) ENABLING CHAIN SCISSION OF BRANCHED PHOTORESIST

(75) Inventors: Heidi B. Cao, Portland, OR (US); Robert P. Meagley, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/964,200

(22) Filed: Oct. 12, 2004

(65) Prior Publication Data
US 2005/0106498 A1    May 19, 2005

Related U.S. Application Data

(63) Continuation of application No. 10/663,583, filed on Sep. 16, 2003, now Pat. No. 6,872,505.

(51) Int. Cl.
*G03F 7/039* (2006.01)

(52) U.S. Cl. .................. 430/270.1; 430/905; 430/908; 430/910; 522/2; 522/130; 522/163; 522/165; 522/914

(58) Field of Classification Search ............. 430/270.1, 430/905, 908, 910; 522/2, 130, 163, 165, 522/914
See application file for complete search history.

(56) References Cited

U.S. PATENT DOCUMENTS

| | | | | |
|---|---|---|---|---|
| 4,897,336 A | * | 1/1990 | Chien | 430/197 |
| 5,214,110 A | * | 5/1993 | Ahad | 525/403 |
| 5,919,442 A | * | 7/1999 | Yin et al. | 424/78.18 |
| 6,872,505 B1 | * | 3/2005 | Cao et al. | 430/270.1 |

* cited by examiner

*Primary Examiner*—Richard L. Schilling
(74) *Attorney, Agent, or Firm*—Trop, Pruner & Hu, P.C.

(57) ABSTRACT

By using a branched long chained chain scission polymer as a photoresist for EUV and 157 nanometer applications, a relatively higher molecular weight polymer with good mechanical properties may be achieved. In addition, by using chain scission technology, line edge roughness and resolution may be improved at the same time.

9 Claims, 3 Drawing Sheets

ENABLING CHAIN SCISSION OF BRANCHED PHOTORESIST

This is a continuation of prior application Ser. No. 10/663,583, filed Sep. 16, 2003 now U.S. Pat. No. 6,872,505.

BACKGROUND

This invention relates generally to the fabrication of integrated circuits and, particularly, to photoresist utilized in the manufacturing of integrated circuits.

A thin photoresist film is patterned and used as a sacrificial layer to transfer the pattern to the underlying substrate during the manufacturing of integrated circuits. Patterns are created in a photoresist film as a result of exposure to radiation through a mask. The radiation causes a chemical reaction that changes the solubility of the photoresist. As a result, upon subsequent exposure to a developer solution, some of the photoresist may remain and other of the photoresist may be removed resulting in the transfer of a pattern from the exposure mask to the semiconductor structure.

This pattern, now resident in the photoresist structure, may in turn be utilized as a mask to remove portions of the underlying semiconductor structure using chemical etching processes. Thus, the use of photoresist enables the repeated fabrication of a large number of integrated circuits using a single mask that repeatedly transfers the same pattern to the semiconductor structure.

It has been the goal for many years in semiconductor fabrication to reduce the size of the features that are fabricated. Smaller integrated circuits generally mean faster integrated circuits and lower cost integrated circuits. One way to reduce the feature size is to use improved lithography. Generally, lithography improvements have been the result of changing the wavelength of the radiation used to expose the pattern. With wavelengths that are able to define even smaller patterns, the photoresist technology will also need to be improved to realize a decreased feature size. Namely, when smaller features may be exposed through improvements in lithography, it is also necessary that the photoresist be able to define the smaller features enabled by improved lithography.

The size of the features that undergo dissolution in the photoresist ultimately limits the line edge roughness (LER) and resolution that is available with any lithographic system. Line edge roughness is the roughness of the edge of the photoresist. This roughness is transferred to the underlying semiconductor structure in the subsequent processing steps, adversely affecting device performance. Thus, many manufacturers of integrated circuits have focused on reducing the molecular weight of the polymers used in photoresist in order to reduce line edge roughness and increase resolution.

Unfortunately, a reduction of molecular weight of these photoresist forming polymers may have a negative impact on the mechanical properties of the photoresist. For example, lower molecular weight photoresists may be more likely to exhibit photoresist pattern collapse. Obviously, when the pattern collapses, the photoresist may be non-functional.

Thus, there is a need for better photoresists that exhibit desirable line edge roughness and improved resolution, without resist photoresist pattern collapse at relatively high resolution radiation wavelengths, such as extreme ultraviolet (EUV) or 157 nanometers.

DETAILED DESCRIPTION

Traditionally the difference in the solubility of the exposed and unexposed photoresist in a developer solution occurs when protecting groups are cleaved in the exposed region. Once these groups are cleaved, the solubility of the polymer changes, usually with the cleavage of non-polar side groups from the polymer backbone leaving polar groups in their place that are more soluble in an aqueous base. The entire polymer molecule may then be selectively dissolved in a developer.

The minimum value possible for resolution and line edge roughness is determined by the size of the polymer molecules. Furthermore, polymer molecules are known in some cases to entangle with each other, forming aggregates composed of many polymer molecules that dissolve as a single unit, further limiting resolution and line edge roughness.

Chain scission is a chemical reaction resulting in the breaking of chemical bonds. A chemical bond is a bond between two atoms of a sequence of atoms in the constitutional units of a macromolecule, an oligomer molecule, a block, or a chain which defines the essential geometric representation of a polymer.

In polymers that undergo chain scission, the difference in solubility between the exposed and unexposed regions is driven primarily by differences in molecular weight. Because the size of the polymer segments that are dissolving are small, the resolution and line edge roughness are not limited by the size of the chain scission polymer. Since segments cleaved from polymer after chain scission undergo dissolution rather than the entire polymer, the molecular weight is decoupled from the resolution and line edge roughness.

Therefore, a relatively higher molecular weight polymer may be utilized to improve mechanical properties such as Young's modulus and yield stress. Also, by using branched polymers, better mechanical properties may be achieved in some embodiments. In some embodiments, the molecular weight of the polymer may be greater than 10000 Daltons. The branches may be long chains having sizes greater than 5000 Daltons in some embodiments.

Figure 1:
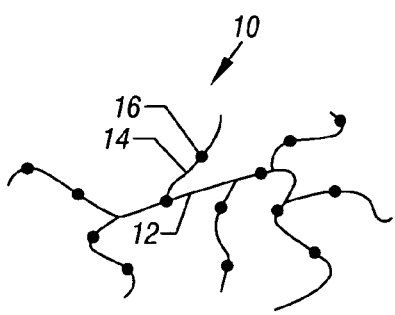
FIG. 1 is a schematic depiction of one embodiment of the present invention.

The size of the scissioned polymer segments after exposure may be engineered by changing the number of scissionable linkages in the polymer's backbone. For example, referring to FIG. 1, a chain scission polymer 10 may include a polymer backbone 12 with branches 14 extending therefrom. Chain scission points 16 may be defined along the length of the branches 14 which chain scission points may be subject to a chain scission reaction.

Due to the large molecular weights that can be used with chain scission polymers, the mechanical properties of branched chain scission photoresist may be improved. The size of the polymer molecule is decoupled from its imaging properties. Long branches may be incorporated into the polymer. These modifications of branch length and molecular weight improve the mechanical properties of the photoresist and reduce the severity of any photoresist collapse.

Figure 2A:
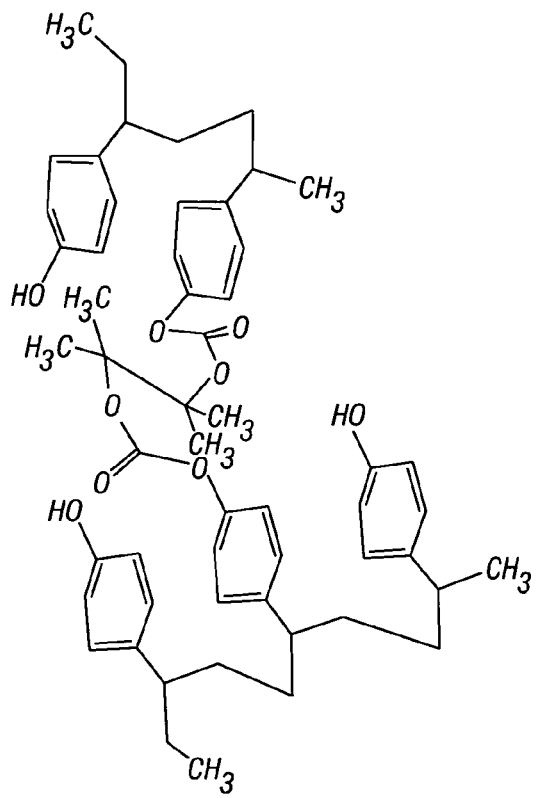
FIGS. 2A and 2B are depictions of the chemical structure of embodiments of the present invention.

An extreme ultraviolet (EUV) photoresist may use a branched chain scission polymer such as poly hydroxystyrene-type polymer shown in FIG. 2A.

The structure shown in FIG. 2A is oligo-4-hydroxystyrene with tertiarycarbonated linked branches having a stable backbone with cleavable branches. A scissionable linkage may be present between the long chain branch and the main polymer branch so that upon irradiation, the long chain branch is cleaved from the polymer backbone.

Figure 2B:
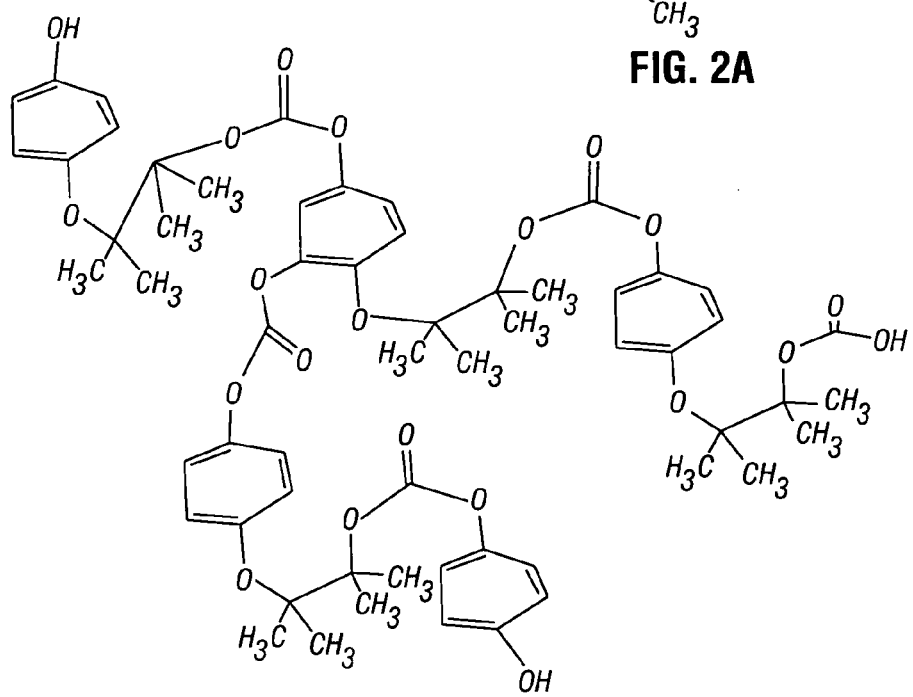

In FIG. 2B, a branched chain scissionable polymer is illustrated where each repeat unit within the polymer branches and as well within the polymer backbone can undergo scission. The structure shown in FIG. 2B is an oligo-1,4-dihydroxyphenylcarbonate-bis tertiary alcohol with appended tertiary alcohol carbonate side chains that provide both a cleavable backbone and cleavable branches.

Figure 3A:
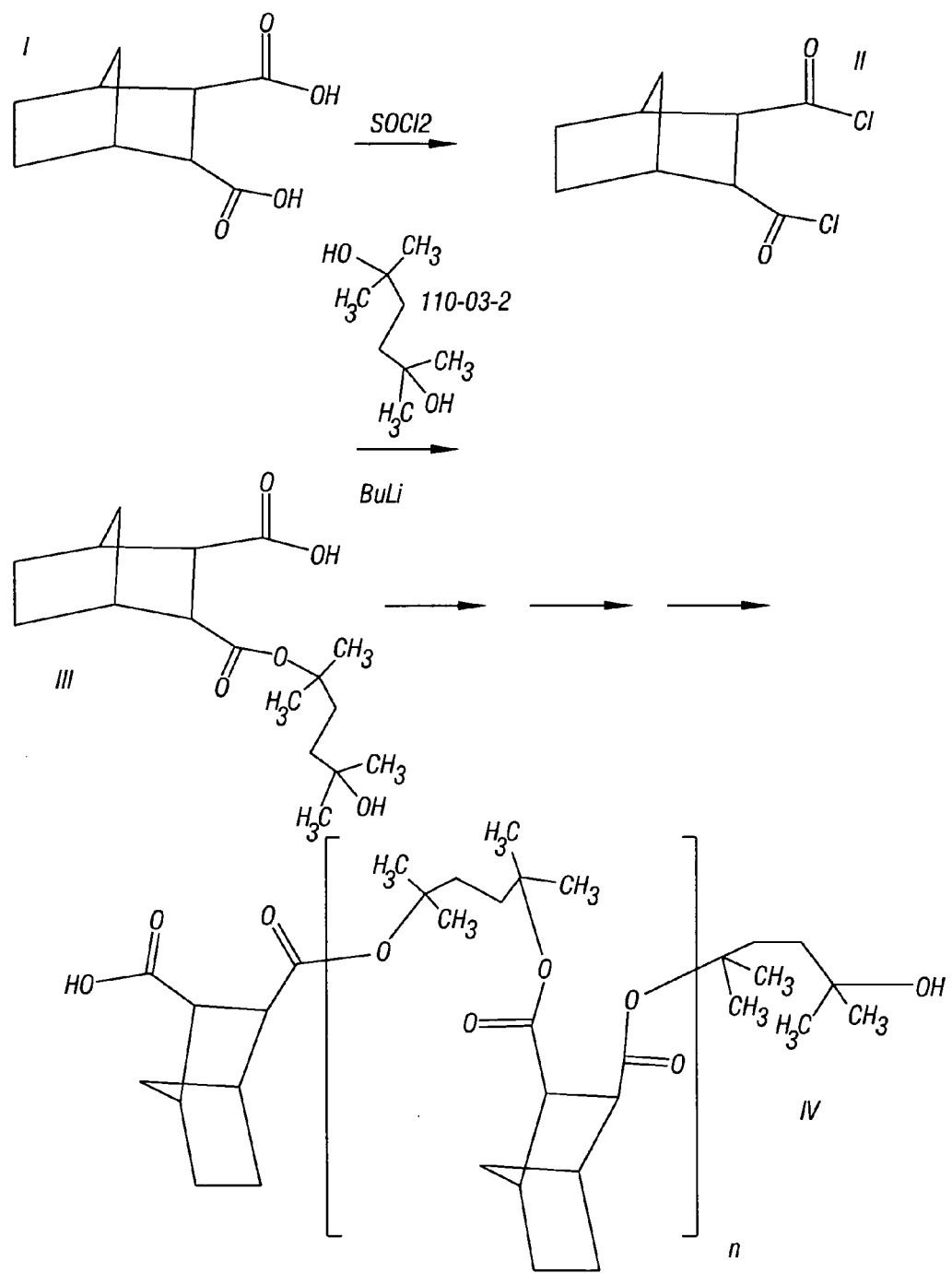
FIGS. 3A and 3B are depictions of the chemical systems of another embodiment of the present invention.
Figure 3B:
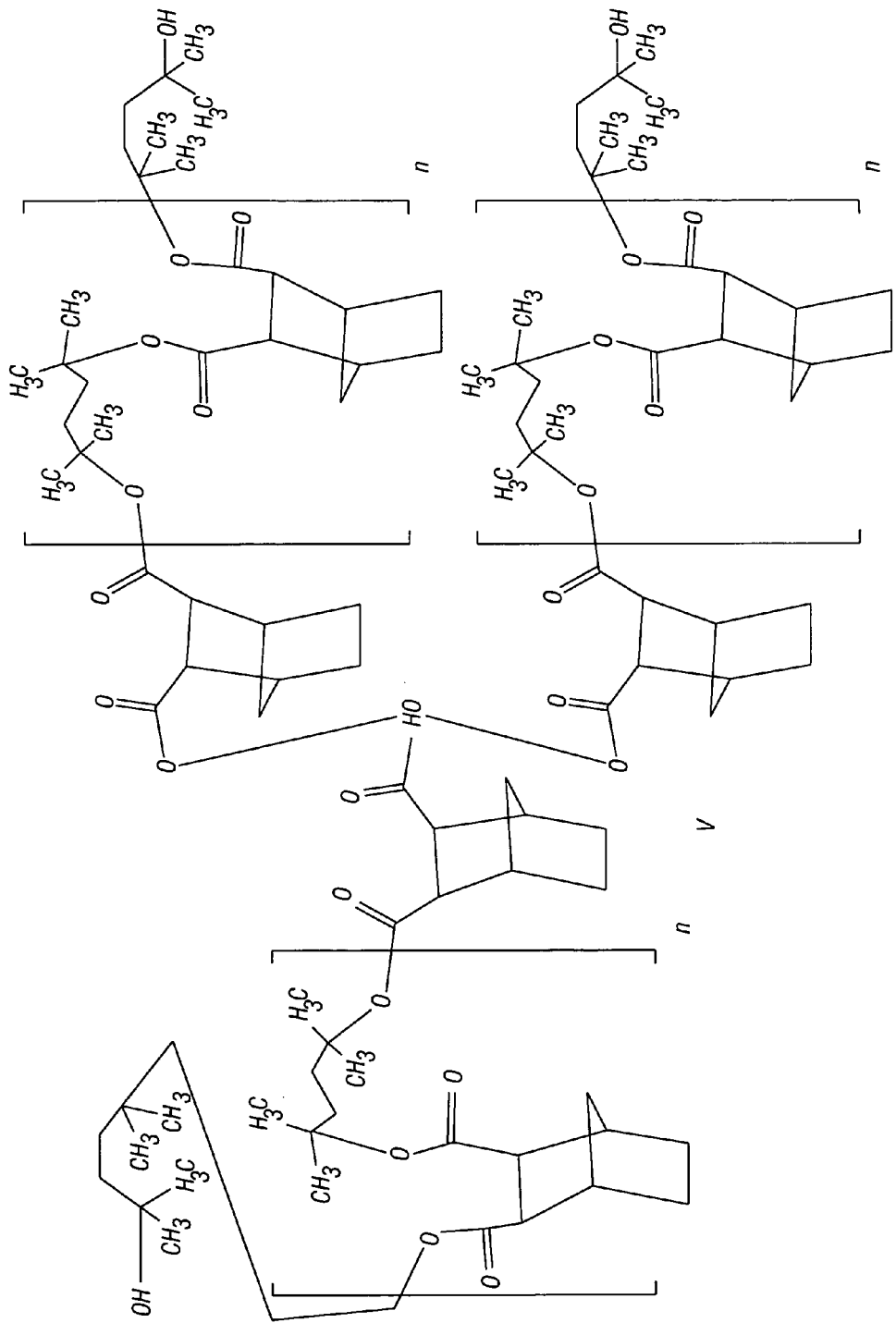

In FIG. 3A, the synthesis for a scissionable branched nobornyl star polymer is shown. In this structure, each repeat unit within the polymer can undergo scission. Compound I is norbornane dicarboxylic acid, which is reacted with $SOCl_2$ to form Compound II. Compound II is a norbornane diester. Compound II is reacted with a short chain diacid, as indicated in FIG. 3A to form the complex norbornane star, Compound III. Units of Compound III may then be linked together to form Compound IV. The Compound IV may be reacted with trifluoroaceticanhydride (TFFA), glycerol and $NH_4OH$ to form Compound V, which is a scissionable branch norbornyl star, shown in FIG. 3B.

The examples shown in the FIGS. 2 and 3 illustrate different numbers of scissionable linkages and branching configurations that are possible within a chain scission polymer. The scissionable linkages may also be distributed at strategic intervals within the polymer. As well, the ratio of branched to straight chain polymer may be varied to meet specific lithographic requirements.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
   a semiconductor substrate; and
   an unexposed photoresist, including a branched chain scission polymer, over said substrate.

2. The structure of claim 1 wherein said branched chain scission polymer includes scissionable and non-scissionable linkages.

3. The structure of claim 1 including a scissionable linkage in a branch of said polymer.

4. The structure of claim 1 including a polymer having a molecular weight greater than 10,000 Daltons.

5. The structure of claim 1 including a polymer having a branch having a molecular weight greater than 5000 Daltons.

6. The structure of claim 1 wherein said polymer includes oligo-4-hydroxystyrene.

7. The structure of claim 6 including a tertiary carbonated link branch.

8. The structure of claim 6 including an oligo-1,4-dihydroxy-phenylcarbonate-bis tertiary alcohol.

9. The structure of claim 8 including an appended tertiary alcohol carbonate side chain on said polymer.

* * * * *